(12) United States Patent
Lin et al.

(10) Patent No.: US 8,269,415 B2
(45) Date of Patent: Sep. 18, 2012

(54) ORGANIC LIGHT EMITTING DEVICE, ILLUMINATION DEVICE AND LIQUID CRYSTAL DISPLAY DEVICE HAVING HIGH OVERALL APERTURE RATIO

(75) Inventors: Chen-Chi Lin, Hsinchu County (TW); Chieh-Wei Chen, Taichung County (TW); Chun-Liang Lin, Taipei County (TW); Ting-Kuo Chang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 12/909,830

(22) Filed: Oct. 22, 2010

(65) Prior Publication Data
US 2012/0038847 A1  Feb. 16, 2012

(30) Foreign Application Priority Data
Aug. 13, 2010  (TW) .............................. 99127138 A

(51) Int. Cl.
*H01J 1/62* (2006.01)
*H05B 37/02* (2006.01)
(52) U.S. Cl. .................. 313/504; 315/169.3; 315/169.1; 257/40

(58) Field of Classification Search .......... 313/500–512; 315/169.1, 169.3; 257/40, 72, 98–100, 642–643, 257/759
See application file for complete search history.

(56) References Cited

U.S. PATENT DOCUMENTS

| | | | |
|---|---|---|---|
| 6,995,035 B2 | 2/2006 | Cok et al. | |
| 7,012,585 B2 | 3/2006 | Agostinelli et al. | |
| 7,528,544 B2* | 5/2009 | Kwak et al. | 313/506 |
| 2007/0200111 A1* | 8/2007 | Itoh et al. | 257/59 |
| 2008/0137008 A1* | 6/2008 | Rogojevic et al. | 349/69 |

* cited by examiner

*Primary Examiner* — Tracie Y Green
(74) *Attorney, Agent, or Firm* — Jianq Chyun IP Office

(57) ABSTRACT

An organic light emitting device having light emitting units on a substrate is provided. Each light emitting unit includes a first electrode layer, an organic light emitting layer, a second electrode layer, a power line, a resistor line, an insulating layer. The first electrode layer is disposed on the substrate. The organic light emitting layer is disposed on the first electrode layer. The second electrode layer is disposed on the organic light emitting layer. The power line is disposed on the substrate. The resistor line is electrically connected to the first electrode layer, wherein the resistor line partially overlaps with the power line, and an overlapping area occupies 60~100% of a total area of the resistor line. The insulating layer is disposed between the power line and the resistor line, and a contact hole is disposed in the insulating layer to electrically connect the power line and the resistor line.

16 Claims, 5 Drawing Sheets

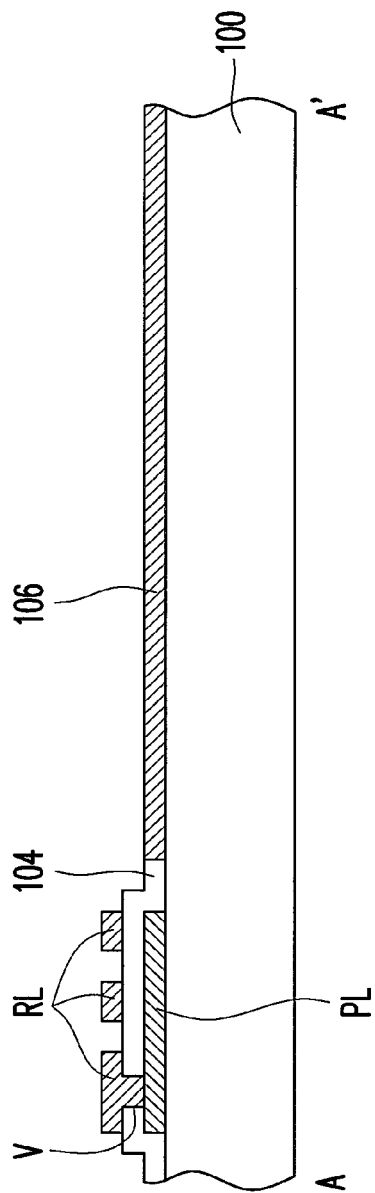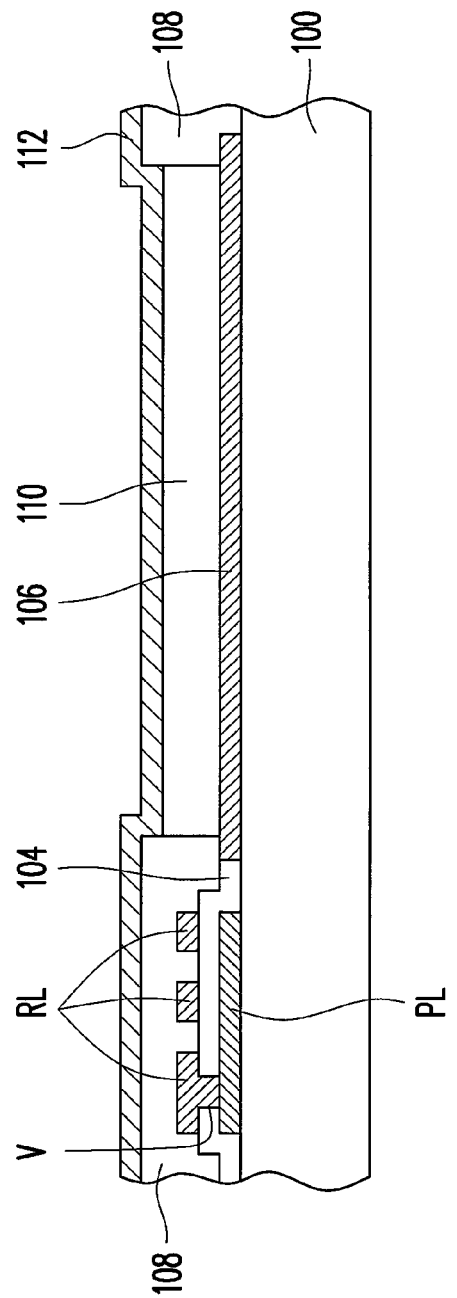

ORGANIC LIGHT EMITTING DEVICE, ILLUMINATION DEVICE AND LIQUID CRYSTAL DISPLAY DEVICE HAVING HIGH OVERALL APERTURE RATIO

CROSS-REFERENCE TO RELATED APPLICATION

This application claims the priority benefit of Taiwan application serial no. 99127138, filed on Aug. 13, 2010. The entirety of the above-mentioned patent application is hereby incorporated by reference herein and made a part of this specification.

BACKGROUND

1. Field of the Invention

The present invention relates to an organic light emitting device and an illumination device and a liquid crystal display device incorporating the organic light emitting device.

2. Description of Related Art

An organic light emitting device offers a variety of desirable features, such as a thin-body implementation, self-emissive property, low power consumption, no backlight source, a wide viewing angle, and a high reaction rate, etc. Thus, in recent years, an organic light emitting device has become the mainstream of flat screen displays. Moreover, a passive organic light emitting device may be formed as an array structure on a light and thin, flexible substrate material. Hence, an organic light emitting device is also suitable for illumination purposes. Typically, the light emitting efficiency of an organic light emitting device is estimated to increase to 100 Lm/W or higher, and the color rendering index is higher than 80. Accordingly, an organic light emitting device could replace a typical illumination light source and could serve an important role in illumination apparatuses.

In an organic light emitting device that has a large area, the presence of a single foreign particle may lead to short circuit of the entire organic light emitting device. Hence, an organic light emitting device having a large area is normally divided into a plurality of small-area light emitting units. Moreover, each light emitting unit is connected to a resistor. The above resistor may limit the current passing through the light emitting unit during a short circuit to prevent other emitting units from being affected. However, the disposition of the above resistor will lower the overall aperture ratio of the organic light emitting device.

SUMMARY OF THE DISCLOSURE

The disclosure is directed to an organic light emitting device, and an illumination device and a liquid crystal display device including therewith the organic light emitting device, wherein the problem that the overall aperture ratio of a light emitting device is lowered by a resistor as in the conventionally organic light emitting device is resolved.

An exemplary embodiment of the disclosure provides an organic light emitting device that includes a plurality of light emitting units disposed on a substrate. Each light emitting unit includes a first electrode layer, an organic light emitting layer, a second electrode layer, a power line, a resistor line and an insulation layer. The first electrode layer is disposed on the substrate. The organic light emitting layer is disposed on the first electrode layer. The second electrode layer is disposed on the organic light emitting layer. The power line is disposed on the substrate. The resistor line and the first electrode layer are electrically connected, wherein the resistor line and the power line are at least partially overlapped, and an overlapping area between the resistor line and the power line is about 60 to 100%. An insulation layer is positioned between the power line and the resistor line, wherein the insulation layer comprises a contact hole therein for electrically connecting the power line and the resistor line.

An exemplary embodiment of the disclosure provides an illumination device, which includes a controller and an organic light emitting device. The organic light emitting device and the controller are electrically connected, and the organic light emitting device includes a plurality of light emitting units disposed on a substrate. Each light emitting unit includes a first electrode layer, an organic light emitting layer, a second electrode layer, a power line, a resistor line and an insulation layer. The first electrode layer is disposed on the substrate. The organic light emitting layer is disposed on the first electrode layer. The second electrode layer is disposed on the organic light emitting layer. The power line is disposed on the substrate. The resistor line and the first electrode layer are electrically connected, wherein the resistor line and the power line are at least partially overlapped, and an overlapping area between the resistor line and the power line is about 60 to 100%. An insulation layer is positioned between the power line and the resistor line, wherein the insulation layer includes a contact hole therein for electrically connecting the power line and the resistor line.

An exemplary embodiment of the disclosure provides a liquid crystal display device, which includes a liquid crystal display panel and a backlight module. The backlight module is positioned at the back side of the liquid crystal display panel, wherein the backlight module includes a plurality of light emitting units disposed on a substrate. Each light emitting unit includes a first electrode layer, an organic light emitting layer, a second electrode layer, a power line, a resistor line and an insulation layer. The first electrode layer is disposed on the substrate. The organic light emitting layer is disposed on the first electrode layer. The second electrode layer is disposed on the organic light emitting layer. The power line is disposed on the substrate. The resistor line and the first electrode layer are electrically connected, wherein the resistor line and the power line are at least partially overlapped, and an overlapping area between the resistor line and the power line is about 60 to 100%. An insulation layer is positioned between the power line and the resistor line, wherein the insulation layer comprises a contact hole therein for electrically connecting the power line and the resistor line.

According to the disclosure, the overlapping area between the resistor line and the power line in the light emitting device is about 60 to 100%. Since the power line is originally an opaque material, the overlapping of the resistor line RL and the power line PL may reduce the effect of the disposition of the resistor line RL on the aperture ratio and light transmittance. Ultimately, the overall aperture ratio of the organic light emitting device is increased.

BRIEF DESCRIPTION OF THE DRAWINGS

FIG. 2A is a schematic, cross-sectional view along the cutting line A-A' of FIG. 1.

FIG. 2B is a schematic, cross-sectional view diagram of an organic light emitting device according to an exemplary embodiment of the disclosure.

DESCRIPTION OF EMBODIMENTS

Figure 1:
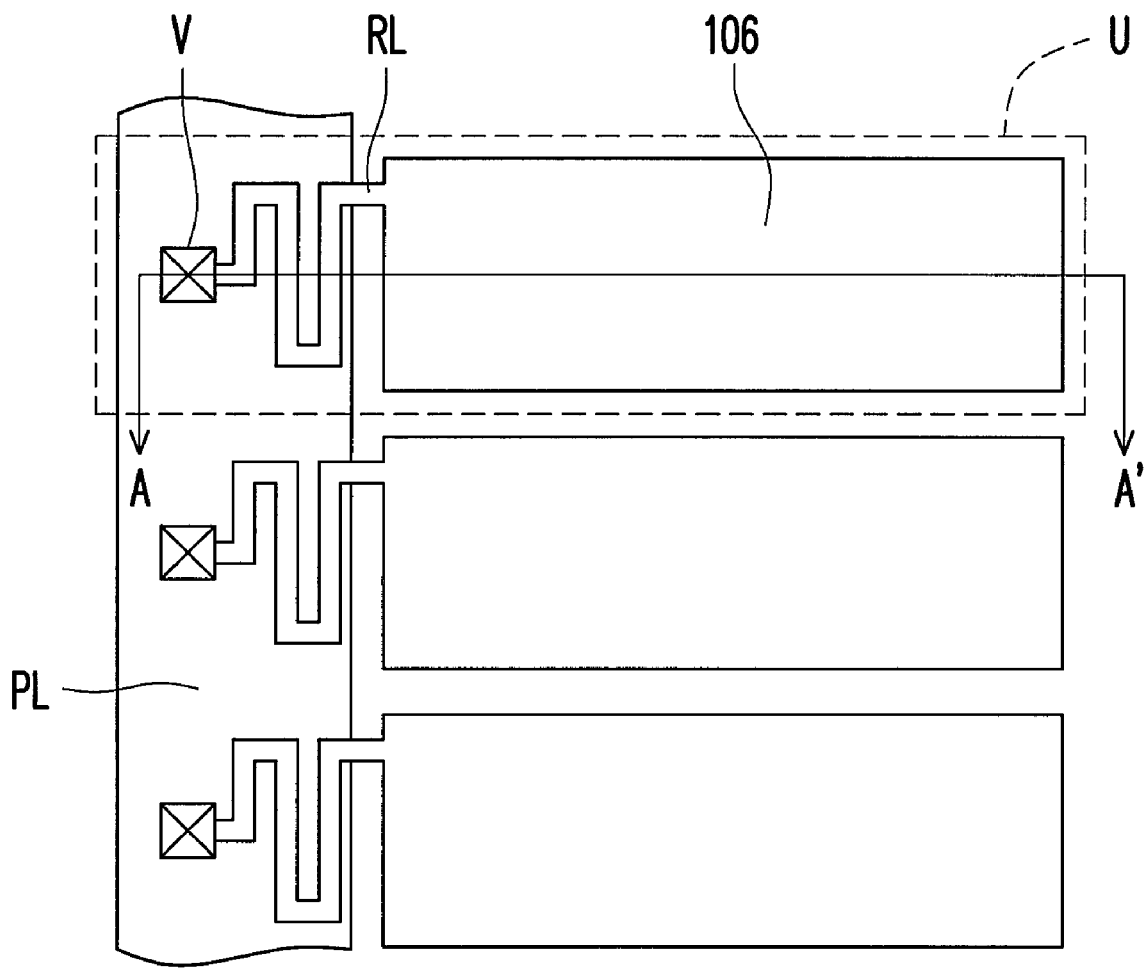
FIG. 1 is a schematic, top view diagram illustrating an organic light emitting device according an exemplary embodiment of the disclosure.

FIG. 1 is a schematic, top view diagram illustrating an organic light emitting device according an exemplary embodiment of the disclosure. FIG. 2A is a schematic, cross-sectional view along the cutting line A-A' of FIG. 1. FIG. 2B is a schematic, cross-sectional view diagram of an organic light emitting device according to an exemplary embodiment of the disclosure. To better illustrate the embodiments of the disclosure, the top view in FIG. 1 only illustrates a power line, a resistor line and a first electrode layer. In reality, the structure of a more complete organic light emitting device is shown in FIG. 2B.

Referring to FIGS. 1, 2A and 2B, the organic light emitting device includes a plurality of light emitting units U disposed on a substrate 100. Each light emitting unit U includes a first electrode layer 106, an organic light emitting layer 110, a second electrode layer 112, a power line PL, a resistor line RL and insulation layers 104, 108.

In this exemplary embodiment, the power line PL is positioned on the substrate 100. A material of the substrate 100 may includes glass, quartz, organic polymer, plastic, flexible plastic or opaque/reflective material. The power line PL mainly serves to provide electric power for each emitting unit. Hence, the power line PL, extending to the border of the substrate 100, is electrically connected to a power supply apparatus. In the consideration of electrical conductivity, the power line PL is formed with, for example, copper, aluminum, silver, gold, titanium, molybdenum, tungsten, chromium and/or other alloys or a stack layer. It is worthy to note that other materials may be applied for the power line. According to other exemplary embodiments, the material of the power line may include other materials, such as an alloy, a metal oxide material, a metal nitride material, a metal oxynitride material, or other appropriate materials, or stack layers of a metal material and other conductive materials.

The insulation layer 104 is disposed on the substrate 100, covering the power line PL. The material of the insulation layer 104 includes an inorganic material (such as, silicon oxide, silicon nitride, silicon oxynitride, other appropriate materials, or a combination of the above materials, or a stack layer of at least two of the above materials), an organic material, or other appropriate materials or a combination of the above materials. Moreover, the insulation layer 104 includes a contact hole V therein, exposing the power line PL.

An opening is formed in the insulation layer 104 preferably at the position of the first electrode layer 106, allowing the first electrode layer 106 to directly contact with the substrate 100. In a varying exemplary embodiment, the first electrode layer 106 may also form on the insulation layer 104, and the resistor line RL and the first electrode layer 106 are electrically connected. According to the exemplary embodiment, the resistor line RL and the first electrode layer 106 are directly connected together. Alternatively speaking, the resistor line RL and the first electrode layer 106 are formed of the same film layer. In this exemplary embodiment, the materials of the resistor line RL and the first electrode layer 106 are the same. More specifically, the resistor line RL and the first electrode layer 106 are formed by, for example, depositing a conductive layer on the insulation layer 104, followed by patterning the conductive layer to concurrently define the resistor line RL and the first electrode layer 106. The insulation layer 104 is disposed between the power line P1 and the resistor line RL. Further, the resistor line RL is electrically connected to the power line PL through the contact hole V in the insulation layer 104.

According to the exemplary embodiment, the material of the resistor line RL and the first electrode layer 106, for example, a transparent electrode layer, are, for example, a metal oxide material layer, such as indium tin oxide, indium zinc oxide, aluminum tin oxide, indium germanium zinc oxide, or other appropriate metal oxides, or a stack layer including at least two of the above metal oxide materials, a thin metal layer of high light transmittance or a thin metal stack layer. It should be appreciated that according to other exemplary embodiments, the materials of the resistor line RL and the first electrode layer 106 include an opaque material. Further, the resistor line and the first electrode layer 106 are not limited to be the same material, and the resistor line and the first electrode layer 106 may formed of different film layers.

Further, according to an exemplary embodiment, the resistor line RL is a transparent winding pattern. The winding pattern illustrated in the figures is used solely for illustration purpose. In other words, the shape of the winding pattern of the resistor line RL is not particularly limited. In other exemplary embodiments, the winding pattern of the resistor line RL could have an arc pattern or other irregular winding pattern.

It is worthy to note that in the exemplary embodiment, the resistor line RL and the power line PL are at least partially overlapped, and the overlapping area between the resistor line RL and the power line PL is about 60 to 100%. More specifically, for one light emitting unit U, the overlapping area between the resistor line RL and the power line PL is about 70 to 98% of the total area of the resistor line. In an alternative embodiment, the overlapping area between the resistor line RL and the power line PL is about 70 to 98%. In other words, for one emitting unit, the overlapping area between the resistor line RL and the power line PL occupies about 70 to 98% of the total area of the resistor line. In yet another exemplary embodiment, the overlapping area between the resistor line RL and the power line PL is about 85 to 95%, which means for one emitting unit, the overlapping area between the resistor line RL and the power line PL occupies about 85 to 95% of the total area of the resistor line. In this exemplary embodiment, the power line PL and the first electrode layer 106 do not overlapped.

Referring to FIG. 2B, the organic light emitting layer 110 is disposed on the first electrode layer 106. In the exemplary embodiment, in order for the potential of the organic layer 110 of each light emitting unit U be at a specific position, an insulation layer 108 is formed on the first electrode layer 106 prior to the formation of the light emitting layer 110. The insulation layer 108 exposes the first electrode layer 106 in each light emitting unit U. Then, the organic light emitting layer 110 is formed, by a spraying method, on the exposed surface of the first electrode layer 108. It is worthy to note the fabrication of the organic light emitting layer 110 is not limited to the above-mentioned method. In other exemplary embodiments, the fabrication of the insulation layer 108 may be omitted, and the organic light emitting layer 100 is formed with an accurate inkjet process or other fabrication methods.

According to another exemplary embodiment, the organic light emitting layer 110 may be a single layer of a light emitting layer or a light emitting layer in conjunction with an electron transmission layer, an electron injection layer, a hole transmission layer, a hole injection layer. The above-mentioned light emitting layer is, for example, a white light emitting material layer or other particular color light (such as red, green, blue, etc.) emitting material layer. Moreover, one of the electron transmission layer, the electron injection layer, the hole transmission layer, and the hole injection layer may be selected to pair with the light emitting layer to form a two-layer, three-layer, four-layer or five-layer stack layer so that the light emitting efficiency of the organic light emitting layer 110 could be enhanced. The material and the structure of the organic light emitting layer are known by a person skilled in the art and will not be repeated in detail herein.

Further, the second electrode layer 112 is disposed on the organic light emitting layer 110. In the exemplary embodiment, the second electrode layer 112 may be a strip shaped conductive layer. The second electrode layer 112 of each light emitting unit U is substantially perpendicular to the power line PL. Similarly, the second electrode layer 112 is, for example, a transparent electrode layer, for example, a metal oxide material layer, such as indium tin oxide, indium zinc oxide, aluminum tin oxide, indium germanium zinc oxide, or other appropriate metal oxides, or a stack layer including at least two of the above metal oxide materials, or a thin metal layer of high light transmittance or a thin metal stack layer. According to other exemplary, the second electrode layer 112 may be an opaque electrode layer.

It is worthy to note that if the first electrode layer 106 and the second electrode layer 112 are both transparent electrode layers, the organic light emitting device is a double-sided light emitting device. If the first electrode layer 106 is a transparent electrode layer and the second electrode layer 112 is an opaque electrode layer, the organic light emitting device is a bottom emission type of light emitting device. If the first electrode layer 106 is an opaque electrode layer and the second electrode layer 112 is a transparent electrode layer, the organic light emitting device is a top light emission type light emitting device.

In the above exemplary embodiments illustrated in FIGS. 1, 2A and 2B, the resistor line RL and the power line PL are at least partially overlapped, and the overlapping area between the resistor line RL and the power line PL is about 60 to 100%. Since the power line PL is not transparent to light at all, the overlapping of the resistor line RL and the power line PL may reduce the effect of the disposition of the resistor line RL on the aperture ratio and light transmittance.

Lowering the effect of the resistor line RL on the aperture ratio/light transmittance of the light emitting unit U via the overlapping of the transistor line RL and the power line PL may be achieved through other exemplary embodiments as disclosed hereinafter.

Figure 3:
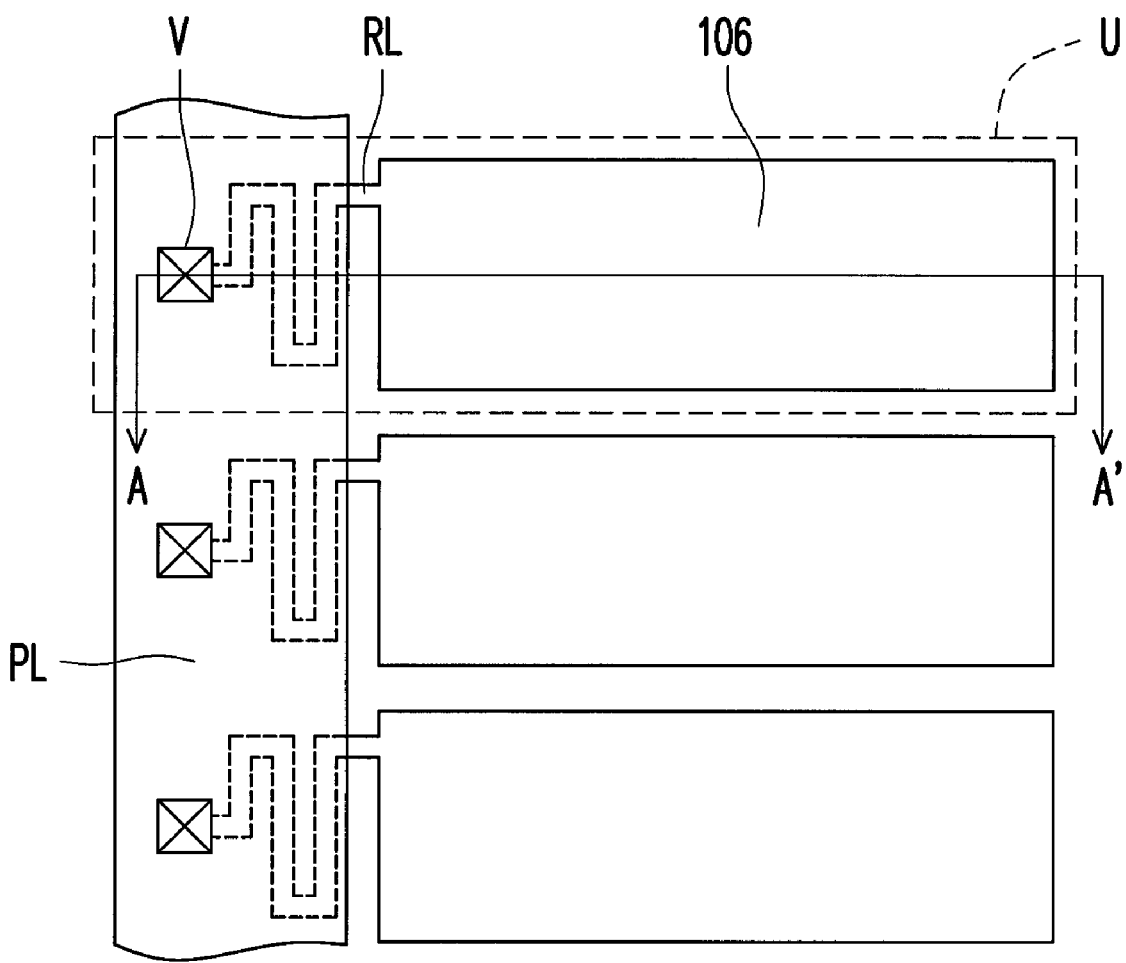
FIG. 3 is a schematic, partial top view diagram illustrating an organic light emitting device according an exemplary embodiment of the disclosure.
Figure 4A:
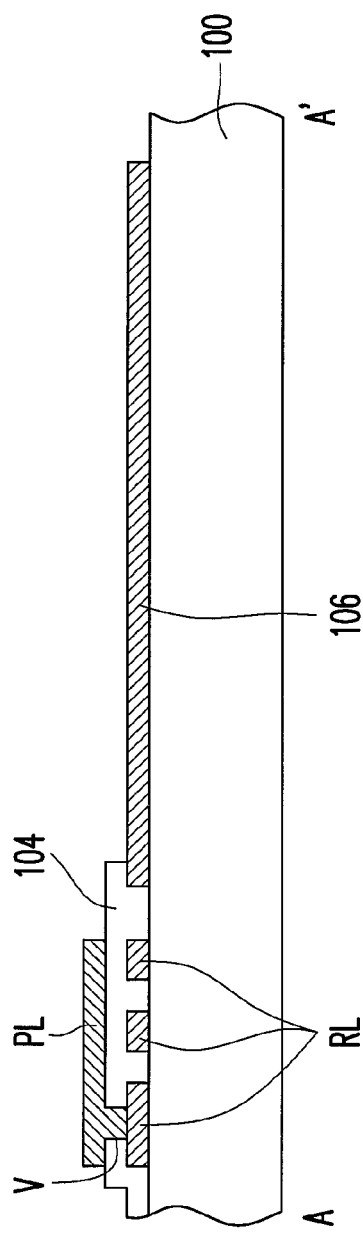
FIG. 4A is a schematic, cross-sectional view along the cutting line A-A' of FIG. 3.
Figure 4B:
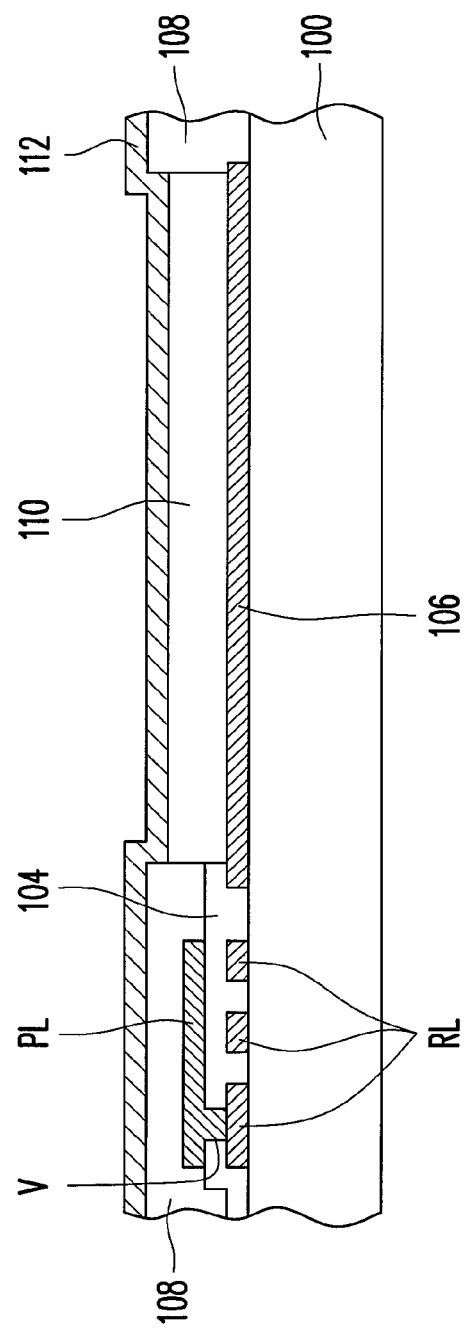
FIG. 4B is a schematic, cross-sectional view diagram of an organic light emitting device according to an exemplary embodiment of the disclosure.

FIG. 3 is a schematic, top view diagram illustrating an organic light emitting device according an exemplary embodiment of the disclosure. FIG. 4A is a schematic, cross-sectional view along the cutting line A-A' of FIG. 3. FIG. 4B is a schematic, cross-sectional view diagram of an organic light emitting device according to an exemplary embodiment of the disclosure. To better illustrate the embodiments of the disclosure, the top view in FIG. 3 only illustrates a power line, a resistor line and a first electrode layer. In reality, the structure of a more complete organic light emitting device is shown in FIG. 4B.

Referring to FIG. 3 (FIGS. 4A and 4B), the exemplary embodiment illustrated in FIG. 3 (FIGS. 4A and 4B) is similar to the exemplary embodiment illustrated in FIG. 1 (FIGS. 2A and 2B); hence, like reference numbers in FIG. 3 (FIGS. 4A and 4B) and FIG. 1 (FIGS. 2A and 2B) refer to like elements throughout. The difference between the exemplary embodiment illustrated in FIG. 3 (FIGS. 4A and 4B) and the exemplary embodiment illustrated in FIG. 1 (FIGS. 2A and 2B) is that the resistor line RL is disposed on the substrate 100, the insulation layer 104 covers the resistor line RL, and the power line PL is disposed on the insulation layer 104. More specifically, the resistor line RL and the first electrode layer 106 are disposed on the substrate 100, and the insulation layer 104 covers the resistor line RL and the first electrode layer 106. Further, the power line. PL is disposed on the insulation layer 104, and the power line PL is electrically connected to the resistor line RL through the contact hole V.

According to an exemplary embodiment of the invention, the material of the resistor line RL and the first electrode layer 106, for example, a transparent electrode layer, include a metal oxide material layer, such as indium tin oxide, indium zinc oxide, aluminum tin oxide, indium germanium zinc oxide, or other appropriate metal oxides, or a stack layer including at least two of the above metal oxide materials, or a thin metal layer of high light transmittance or a thin metal stack layer. It should be appreciated that according to varying exemplary embodiments, the resistor line RL and the first electrode layer 106 may constitute with an opaque material, and the resistor line RL and the first electrode layer could be from a same film layer. Alternatively, the materials of the resistor line RL and the first electrode layer 106 are not limited to be the same. In other exemplary embodiments, the materials of the power line PL and the first electrode layer 106 may be the same, which means the power line PL and the first electrode layer 106 may formed of a same film layer to reduce the production cost.

In the exemplary embodiment illustrated in FIG. 3 (FIGS. 4A and 4B), similarly, the resistor line RL and the power line PL are at least partially overlapped, and the overlapping area between the resistor line RL and the power line PL is about 60 to 100%. More specifically, for one light emitting unit, the overlapping area between the resistor line RL and the power line PL occupies about 60 to 100% of the total area of the resistor line. In an alternative embodiment, the overlapping area between the resistor line RL and the power line PL is about 70 to 98%. In other words, the overlapping area between the resistor line RL and the power line PL occupies about 70 to 98% of the total area of the resistor line. In yet another exemplary embodiment, the overlapping area between the resistor line RL and the power line PL is about 85 to 95%, which means for one emitting unit, the overlapping area between the resistor line RL and the power line PL occupies about 85 to 95% of the total area of the resistor line. Since the power line PL is opaque and not transparent to light, the overlapping of the resistor line RL and the power line PL may reduce the effect of the disposition of the resistor line RL on the aperture ratio and light transmittance.

The organic light emitting device disclosed in the above exemplary embodiments may be applied in an illumination device or a backlight module of a display device, as described below.

Figure 5:
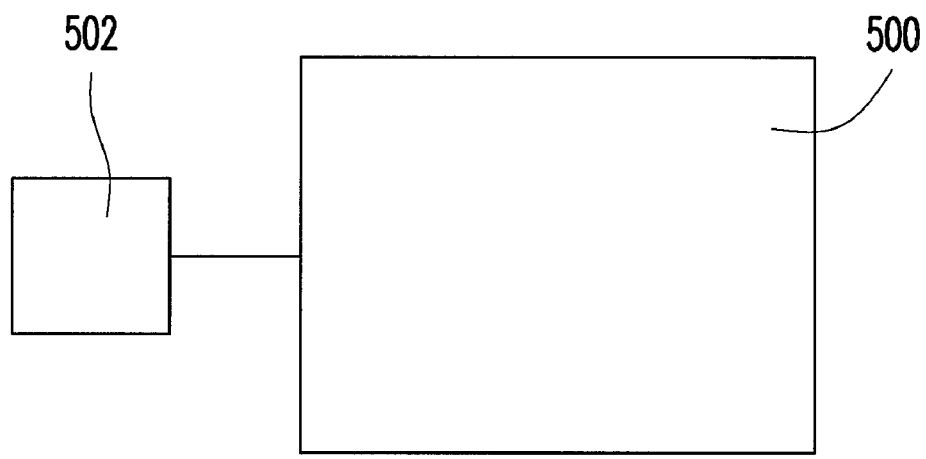
FIG. 5 is a schematic diagram of an illumination device according to an exemplary embodiment of the disclosure.

FIG. 5 is a schematic diagram of an illumination device according to an exemplary embodiment of the disclosure. The illumination device of an exemplary embodiment of the disclosure includes a controller 502 and an organic light emitting device 500. The organic light emitting device 500 and the controller 502 are electrically connected. The organic light emitting device 500 could be the organic light emitting device as shown in FIG. 1 (FIGS. 2A and 2B) or the one shown in FIG. 3 (FIGS. 4A and 4B). The controller 502 is used for controlling the turning on-and-off of the organic light emitting device 500, and even for adjusting the brightness of the organic light emitting device 500. Moreover, the color light emitted by the illumination device is based on the selected material of the organic light emitting layer in the organic light emitting device 500 for displaying the required color, such as white, yellow, red, green, etc. It should be worthy to note that the organic light emitting device 500 in the illumination device may include an organic light emitting layer, which may emit more than two color lights for the illumination device to display multiple color lights.

Figure 6:
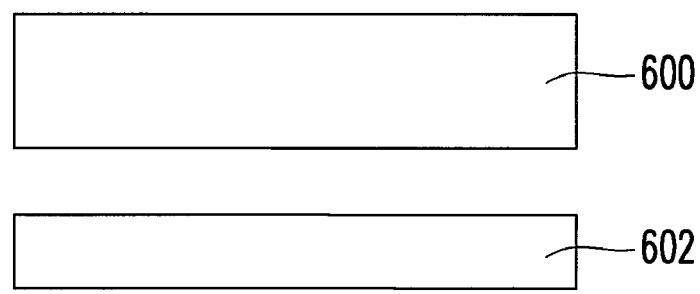
FIG. 6 is a schematic diagram of a liquid crystal display device according to an exemplary embodiment of the disclosure.

FIG. 6 is a schematic diagram of a liquid crystal display device according to an exemplary embodiment of the disclosure. In this exemplary embodiment, a liquid crystal display panel 600 and a backlight module 602 are provided, wherein the backlight module 602 is positioned on the back side of the light crystal display panel 600. In other words, the backlight module 602 may serve as a light emitting source of the light emitting device. Similarly, the light emitting module includes an organic light emitting device as shown in FIG. 1 (FIGS. 2A and 2B) or the one shown in FIG. 3 (FIGS. 4A and 4B). Generally speaking, the backlight module of a liquid crystal display device emits a white light, and a white light emitting material is selected for the organic light emitting layer of the organic light emitting device in the backlight module 602. Alternatively, the red, green, blue light emitting materials could be selected for the organic light emitting layer of the organic light emitting device in the backlight module to form a white light via light mixing. It should be noted that the exemplary embodiments of the disclosure are not limited as such. The organic light emitting device in the light emitting module 602 may emit, aside from emitting a white light, other color lights depending on the requirements.

According to the above disclosure, the overlapping area between the resistor line and the power line in the organic light emitting device is about 60 to 100%. Since the power line is originally an opaque material, the overlapping of the resistor line and the power line may lower the effect of the disposition of the resistor line RL on the aperture ratio, and the overall aperture ratio of the organic light emitting device is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An organic light emitting device, comprising a plurality of light emitting units disposed on a substrate, each of the light emitting units comprising:
   a first electrode layer, disposed on the substrate;
   an organic light emitting layer, disposed on the first electrode layer;
   a second electrode layer, disposed on the organic light emitting layer;
   a power line, disposed on the substrate, wherein the power line is substantially not overlapped with the first electrode layer;
   a resistor line, electrically connected to the first electrode layer, wherein the resistor line and the power line are at least partially overlapped with each other, and an overlapping area between the resistor line and the power line is about 60 to 100%; and
   an insulation layer, positioned between the power line and the resistor line, wherein the insulation layer comprises a contact hole therein, and the power line and the resistor line are electrically connected through the contact hole.

2. The organic light emitting device of claim 1, wherein the power line is disposed on the substrate and the insulation layer covers the power line, and the resistor line is disposed on the insulation layer.

3. The organic light emitting device of claim 2, wherein the overlapping area between the resistor line and the power line is about 70 to 98%.

4. The organic light emitting device of claim 2, wherein overlapping area between the resistor line and the power line is about 85 to 95%.

5. The organic light emitting device of claim 2, wherein the resistor line and the first electrode layer are formed of a same film layer.

6. The organic light emitting device of claim 2, wherein the resistor line and the first electrode layer are constituted with a same material.

7. The organic light emitting device of claim 1, the resistor line comprises a transparent winding pattern.

8. The organic light emitting device of claim 1, wherein the resistor line is disposed on the substrate, and the insulation layer covers the resistor line, and the power line is disposed on the insulation layer.

9. The organic light emitting device of claim 8, wherein the overlapping area between the resistor line and the power line is about 70 to 98%.

10. The organic light emitting device of claim 8, wherein overlapping area between the resistor line and the power line is about 85 to 95%.

11. The organic light emitting device of claim 8, wherein the resistor line and the first electrode layer are formed of a same film layer.

12. The organic light emitting device of claim 8, wherein the resistor line and the first electrode layer are constituted with a same material.

13. The organic light emitting device of claim 1, wherein at least one of the first electrode layer and the second electrode layer is a transparent electrode layer.

14. An illumination device, comprising:
   a controller;
   an organic light emitting device, electrically connected with the controller, the organic light emitting device comprising a plurality of light emitting units disposed on a substrate, each of the light emitting units comprising:
   a first electrode layer, disposed on the substrate;
   an organic light emitting layer, disposed on the first electrode layer;
   a second electrode layer, disposed on the organic light emitting layer;
   a power line, disposed on the substrate, wherein the power line is substantially not overlapped with the first electrode layer;
   a resistor line, electrically connected to the first electrode layer, wherein the resistor line and the source are at least partially overlapped, and an overlapping area between the resistor line and the power line is about 60 to 100%; and
   an insulation layer, disposed between the power line and the resistor line, wherein the insulation layer comprises a contact hole therein, and the power line and the resistor line are electrically connected via the contact hole.

15. A liquid crystal display device, comprising:
a liquid crystal display panel; and
a backlight module, located at a back side of the liquid crystal panel, wherein the backlight module comprises a plurality light emitting units disposed on a substrate, and each of the light emitting units comprises:
a first electrode layer, disposed on the substrate;
an organic light emitting layer, disposed on the first electrode layer;
a second electrode layer, disposed on the organic light emitting layer;
a power line, disposed on the substrate, wherein the power line is substantially not overlapped with the first electrode layer;
a resistor line, electrically connected to the first electrode layer, wherein the resistor line and the source are at least partially overlapped, and an overlapping area between the resistor line and the power line is about 60 to 100%; and
an insulation layer, disposed between the power line and the resistor line, wherein the insulation layer comprises a contact hole therein, and the power line and the resistor line are electrically connected via the contact hole.

16. The organic light emitting device of claim 1, wherein the resistor line of each light emitting unit is disposed between the first electrode layer of said light emitting unit and one of the power line, and the resistor lines of the light emitting units are physically separated from each other.

* * * * *